(12) United States Patent
Pons et al.

(10) Patent No.: US 9,736,963 B2
(45) Date of Patent: Aug. 15, 2017

(54) COLD PLATE, FORMING IN PARTICULAR A STRUCTURAL PART OF AN ITEM OF EQUIPMENT HAVING HEAT-GENERATING COMPONENTS

(71) Applicant: Airbus Operations (S.A.S.), Toulouse (FR)

(72) Inventors: Philippe Pons, Muret (FR); Pierre Salles, La Salvetat St Gilles (FR)

(73) Assignee: Airbus Operations (S.A.S.), Toulouse (FR)

( * ) Notice: Subject to any disclaimer, the term of this patent is extended or adjusted under 35 U.S.C. 154(b) by 0 days.

(21) Appl. No.: 14/976,712

(22) Filed: Dec. 21, 2015

(65) Prior Publication Data
US 2016/0192534 A1 Jun. 30, 2016

(30) Foreign Application Priority Data

Dec. 22, 2014 (FR) ...................................... 14 63072

(51) Int. Cl.
*H05K 7/20* (2006.01)
*H01L 23/367* (2006.01)
*H01L 23/473* (2006.01)

(52) U.S. Cl.
CPC ..... *H05K 7/20009* (2013.01); *H01L 23/3672* (2013.01); *H01L 23/473* (2013.01); *H05K 7/20254* (2013.01); *H05K 7/20636* (2013.01); *H01L 2924/0002* (2013.01)

(58) Field of Classification Search
CPC ........ F28F 3/12; H05K 7/202; H05K 7/20009
USPC .................................... 361/679.53, 699, 702
See application file for complete search history.

(56) References Cited

U.S. PATENT DOCUMENTS

| 4,153,225 A * | 5/1979 | Paulsen ............. H05K 7/20572 244/118.1 |
| 4,315,300 A | 2/1982 | Parmerlee et al. |
| 4,322,776 A | 3/1982 | Job et al. |

(Continued)

FOREIGN PATENT DOCUMENTS

| EP | 1 175 135 A1 | 1/2002 |
| JP | 2001-035981 A | 9/2001 |

(Continued)

OTHER PUBLICATIONS

French Search Report for Application No. 1463072 dated Oct. 30, 2015.

*Primary Examiner* — Adrian S Wilson
(74) *Attorney, Agent, or Firm* — Jenkins, Wilson, Taylor & Hunt, P.A.

(57) ABSTRACT

A cold plate for cooling heat-generating components, includes two plates extending parallel to each other. A core is sandwiched between the two plates to form a sandwich structure, the core including a set of passages for passing a cooling fluid from a first edge to an opposite second edge of the sandwich structure. First and second fluid-tight joining members are disposed respectively on the first and second opposite edges of the sandwich structure, the first fluid-tight joining member including at least one inlet connector and the second fluid-tight joining member including at least one outlet connector for the passage of the cooling fluid. A method for use of the cold plate in particular as a structural part of an avionics equipment item is also provided.

12 Claims, 4 Drawing Sheets

(56) References Cited

U.S. PATENT DOCUMENTS

| | | | | |
|---|---|---|---|---|
| 4,535,386 A * | 8/1985 | Frey, Jr. | H05K 7/206 | 165/104.33 |
| 5,808,866 A * | 9/1998 | Porter | H05K 7/1424 | 174/377 |
| 6,330,152 B1 * | 12/2001 | Vos | H05K 7/206 | 165/104.33 |
| 6,591,898 B1 * | 7/2003 | Chu | F28F 1/32 | 165/104.33 |
| 6,807,056 B2 * | 10/2004 | Kondo | G06F 1/20 | 165/104.33 |
| 6,995,978 B2 * | 2/2006 | Strauss | H05K 7/20918 | 165/185 |
| 7,675,748 B2 * | 3/2010 | Matsushima | G11B 33/128 | 361/679.47 |
| 7,724,516 B2 * | 5/2010 | Harder | H05K 7/202 | 211/41.17 |
| 7,907,406 B1 * | 3/2011 | Campbell | H05K 7/202 | 165/104.33 |
| 8,000,101 B2 * | 8/2011 | Searby | G06F 1/181 | 165/104.33 |
| 8,248,798 B2 * | 8/2012 | Parish | H05K 7/20772 | 165/104.33 |
| 8,250,877 B2 * | 8/2012 | Correa | H05K 7/20781 | 62/259.2 |
| 2001/0042616 A1 * | 11/2001 | Baer | H05K 7/20736 | 165/299 |
| 2002/0079095 A1 * | 6/2002 | Davies | F02M 31/20 | 165/170 |
| 2002/0101718 A1 * | 8/2002 | Negishi | F28F 3/025 | 361/699 |
| 2003/0010477 A1 * | 1/2003 | Khrustalev | H05K 7/20681 | 165/104.33 |
| 2004/0050538 A1 * | 3/2004 | Sunder | F25J 5/002 | 165/133 |
| 2004/0080912 A1 * | 4/2004 | Goth | F28D 15/0266 | 361/699 |
| 2004/0221604 A1 * | 11/2004 | Ota | H05K 7/20781 | 62/259.2 |
| 2005/0117301 A1 * | 6/2005 | Prasher | F28D 15/0233 | 361/699 |
| 2006/0002086 A1 * | 1/2006 | Teneketges | H01L 23/473 | 361/699 |
| 2006/0126296 A1 * | 6/2006 | Campbell | H05K 7/2079 | 361/700 |
| 2006/0157858 A1 | 7/2006 | Furman et al. | | |
| 2007/0012423 A1 * | 1/2007 | Kinoshita | H01L 23/473 | 165/80.4 |
| 2007/0041160 A1 | 2/2007 | Kehret et al. | | |
| 2007/0291452 A1 * | 12/2007 | Gilliland | H05K 7/20781 | 361/699 |
| 2008/0029260 A1 | 2/2008 | Hu et al. | | |
| 2011/0232863 A1 | 9/2011 | Zaffetti et al. | | |
| 2013/0201627 A1 * | 8/2013 | Limbacher | H02B 1/28 | 361/688 |

FOREIGN PATENT DOCUMENTS

| | | |
|---|---|---|
| JP | 2004-063654 A | 2/2004 |
| JP | 2006-202800 | 8/2006 |
| JP | 2008-004667 A | 1/2008 |
| JP | 2011-134979 A | 7/2011 |
| JP | 2013-175532 A | 9/2013 |

* cited by examiner

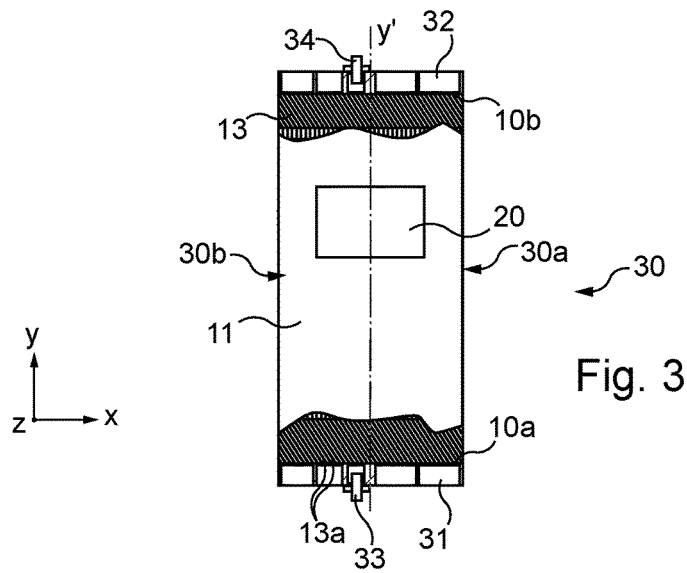
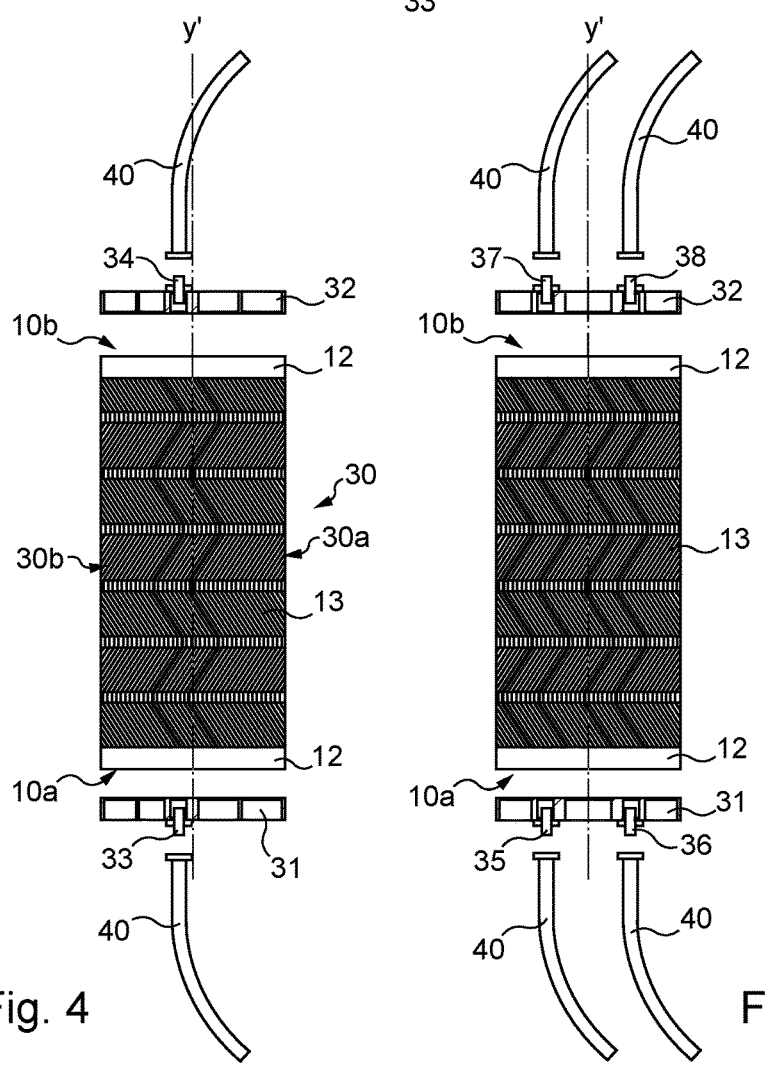
Fig. 3
Fig. 4
Fig. 5

COLD PLATE, FORMING IN PARTICULAR A STRUCTURAL PART OF AN ITEM OF EQUIPMENT HAVING HEAT-GENERATING COMPONENTS

CROSS-REFERENCE TO RELATED APPLICATION

This application claims priority to French Patent Application No. 1463072 filed Dec. 22, 2014, the entire disclosure of which is incorporated by reference herein.

TECHNICAL FIELD

The present disclosure relates to a cold plate for cooling heat-generating components.

Generally, the disclosure herein relates to the field of the cooling of heat-generating components such as electrical systems with high electrical consumption or electronic systems exhibiting a high thermal density.

BACKGROUND

Conventionally, the cold plates can be used for the cooling of circuits implementing power electronic components, or even for the cooling of hot spots generated on printed circuit boards.

In particular, cold plates can be used for the cooling of avionics equipment items present in aircraft.

In this type of use, it is necessary to obtain a good thermal cooling of the heat-generating components while limiting the volume and the weight of the cooling systems.

Thus, a cold plate as described in the document US 2011/0232863 is known, comprising a plurality of plates extending parallel to one another, one of the plates being configured to support a heat-generating device.

The cold plate comprises a frame disposed between two plates and defining a cavity between the two plates.

The cavity houses a fin structure, a cooling fluid passing through the cavity and the fin structure to cool the heat-generating device disposed on the cold plate.

The cooling fluid is introduced into the cavity of the cold plate and recovered through inlet and outlet orifices disposed in one and the same corner of the cold plate.

The cold plate is itself fixed onto a structural element, the latter being fixed for example to a cabin wall or to an avionics bay.

The structural element and the cold plate are configured for supporting the structural load of the heat-generating device.

SUMMARY

An aim of the present disclosure is to propose an improved cold plate, notably exhibiting a good cooling efficiency.

To this end, the present disclosure relates to a cold plate for cooling heat-generating components, comprising two plates extending parallel to one another and a core disposed between the two plates to form a sandwich structure, the core comprising a set of passages for passing at least one cooling fluid from a first edge to an opposite second edge of the sandwich structure.

According to the disclosure herein, first and second fluid-tight joining members are disposed respectively on the first and second opposite edges of the sandwich structure, the first fluid-tight joining member comprising at least one inlet connector for at least one cooling fluid and the second fluid-tight joining member comprising at least one outlet connector for at least one cooling fluid, the first and second fluid-tight joining members blocking all the passages except at least one subset of the set of passages, the at least one inlet connector for at least one cooling fluid being connected with the subset of the set of passages, and the at least one outlet connector for the at least one cooling fluid being connected with the subset of the set of passages.

The passage of at least one cooling fluid in a set of passages and the disposition of an inlet connector and of an outlet connector on two opposite edges of the sandwich structure makes it possible to generate a particularly effective flow of cooling fluid through the core of the cold plate.

The sandwich structure produced from a core disposed between two plates confers on the resulting cold plate a good mechanical resistance.

The production of passages in the core of the sandwich structure of the cold plate avoids the implementation of cooling fluid circulation pipes, which allows for a weight saving in the cold plate.

The fluid-tight joining members make it possible to obtain a modularity of the cold plate, for one and the same sandwich structure; depending on the fluid-tight joining members implemented, one or more subsets of passages can be defined in the cold plate to produce corridors for the passage of cooling fluid within the cold plate according to the hot spots to be cooled.

According to different features and various embodiments of the disclosure herein, which can be taken in isolation or in combination:

- the first fluid-tight joining member, respectively the second fluid-tight joining member, comprises a number of inlet connectors, respectively a number of outlet connectors, for different cooling fluids;
- the first and second fluid-tight joining members are inserted and fixed between the two plates extending beyond the core;
- the set of passages comprises passages closed by at least one of the two plates and emerging respectively on the first edge and on the opposite second edge of the sandwich structure;
- the passages each comprise two walls respectively adjacent to at least one of the two plates;
- the two walls are inclined relative to one another and adjacent to one another to form a passage bottom;
- the core has a wavy form, the top of the waves being in contact with at least one of the two plates;
- the direction of passage of the at least one cooling fluid in the set of passages corresponds to a longitudinal direction of the sandwich structure, the core producing a fluid-tight closure of the cold plate on longitudinal edges of the cold plate;
- the set of passages comprises passages parallel to one another;
- the passages are disposed zigzag fashion from the first edge to the opposite second edge of the sandwich structure.

As an example, the cooling fluid is a liquid, such as water, or a gas, such as air.

According to a second aspect, the present disclosure relates also to a system for cooling heat-generating components, comprising a cold plate as described previously, heat-generating components being disposed in contact with at least one of the two plates.

According to a third aspect, the present disclosure relates finally to the use of a cold plate as described previously as a structural part of an avionics equipment item in an aircraft.

The sandwich structure forming the cold plate is particularly well suited to be used directly as a structural part of an equipment item comprising heat-generating components.

The cold plate thus serves a dual function in the equipment item, making it possible both to support the heat-generating components and to cool them.

There is thus a saving in terms of bulk and weight of the equipment item when implementing such a cooling system.

BRIEF DESCRIPTION OF THE DRAWINGS

Other particular features and advantages of the disclosure herein will become more apparent from the following description.

In the attached drawings, given as nonlimiting examples:

FIG. 3 is a plan view with parts of the cold plate of FIG. 2 cut away;

FIG. 4 is an exploded schematic plan view of the cold plate of FIG. 3, illustrating a first mode of passage of a cooling fluid;

FIG. 5 is a view similar to FIG. 4 illustrating a second mode of passage of cooling fluid;

DETAILED DESCRIPTION

Figure 1:
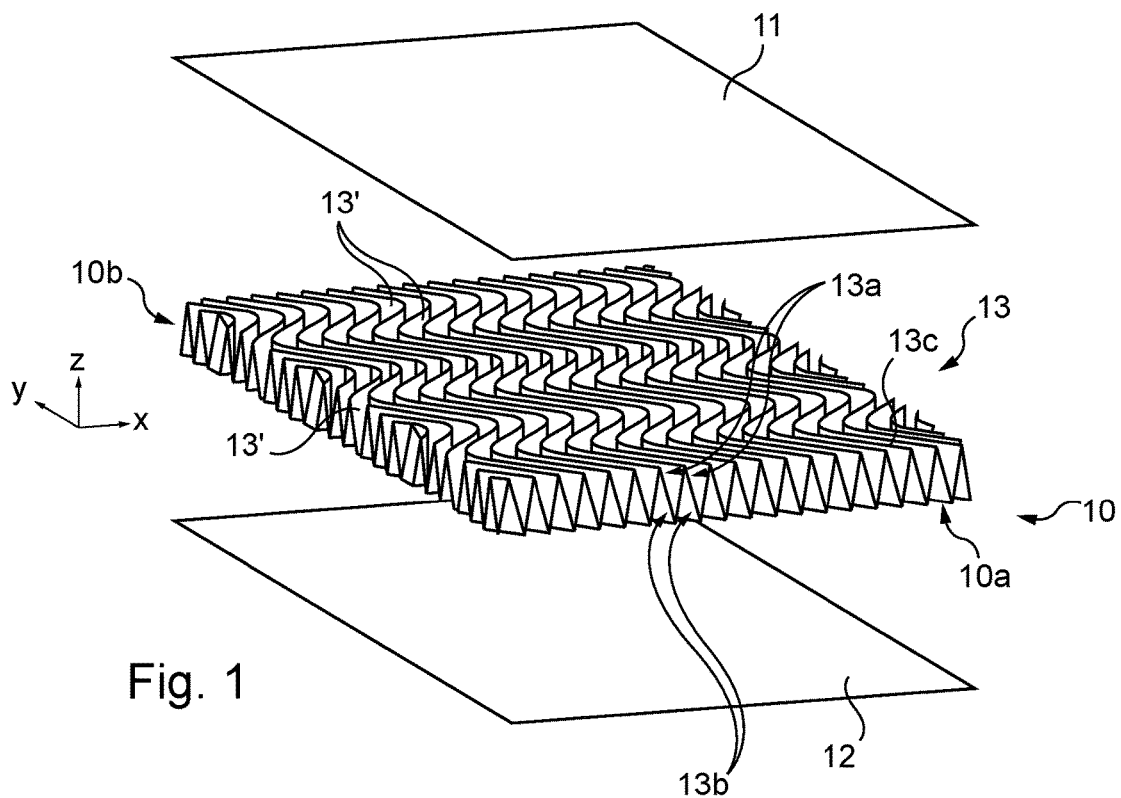
FIG. 1 is an exploded perspective schematic view of a sandwich structure of a cold plate according to a first embodiment of the disclosure herein.
Figure 2:
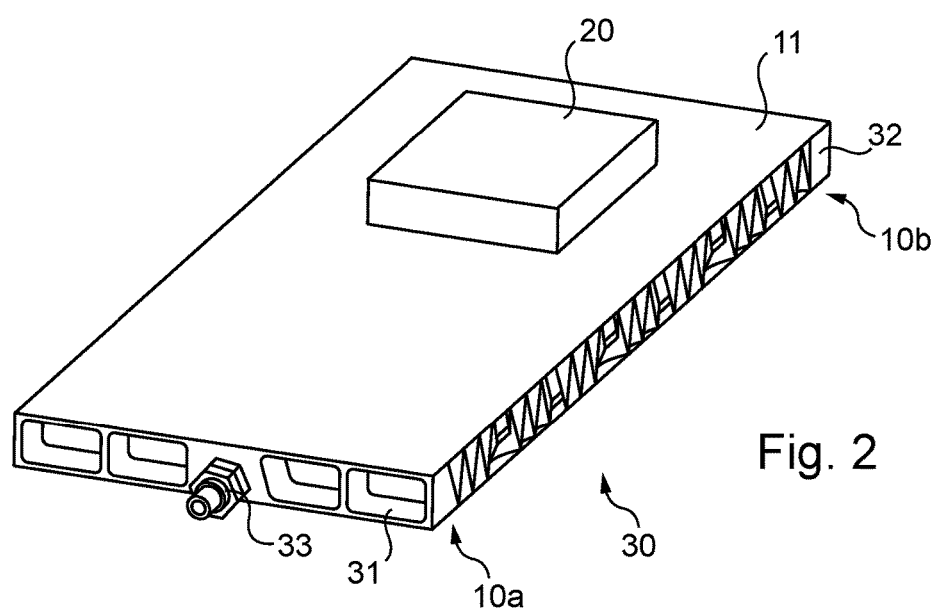
FIG. 2 is a perspective schematic view of a cold plate equipped with a heat-generating component according to the first embodiment of the disclosure herein.

There now follows a description with reference to FIGS. 1 to 3 of a cold plate for cooling heat-generating components according to a first embodiment of the disclosure herein.

Hereinafter in the description, the term "comprising" does not preclude other elements or steps and the term "one" does not preclude the plural.

As is clearly illustrated in FIG. 1, the principle of the cold plate according to a first embodiment of the disclosure herein rests on the formation of a sandwich structure 10.

More particularly, two plates 11, 12 are disposed parallel to one another and a core 13 is sandwiched between the two plates 11, 12 to thus form the sandwich structure 10.

The plates 11, 12 thus constitute the two outer skins of the sandwich structure 10, whereas the core 13 constitutes the heart of this sandwich structure 10.

As a nonlimiting example, the plates 11, 12 can be produced in metal or from composite materials.

Thus, when the cold plate is intended to be used in avionics equipment items, the composite materials that are suited to aeronautical stresses can be used.

Similarly, the core 13 can be produced from metal or composite materials.

Generally, and depending on the use and the application sought for the cold plate, the plates 11, 12 and the core 13 can be commercial off-the-shelf (COTS) components, or, alternatively, be custom-made components.

The plates 11, 12 and the core 13 can be secured to one another by a bonding method, and for example by the implementation of a composite material bonding method.

As a nonlimiting example, such a bonding method can implement steps of pickling and cleaning of the plates 11, 12 and of the core 13, followed by a step of bonding followed by a baking step to secure these parts together and obtain the sandwich structure 10.

Alternatively, the sandwich structure 10 can be produced by implementing an additive manufacturing method of the ALM (Additive Layer Manufacturing) type.

The core 13 comprises a set of passages 13a, 13b allowing for the passage of a cooling fluid.

As clearly illustrated in FIG. 1, in this embodiment, the set of passages 13a, 13b allows the passage of a cooling fluid from a first edge 10a to an opposite second edge 10b of the sandwich structure 10.

Referring to FIG. 1, a longitudinal direction Y of the sandwich structure 10 is defined as corresponding to the direction of passage of the cooling fluid, the first and second opposite edges 10a, 10b thus corresponding to opposite lateral edges of the sandwich structure 10 extending in a transverse direction X of the sandwich structure 10.

In the duly formed sandwich structure, the set of passages 13a, 13b comprises passages 13a, 13b that are closed by one of the two plates 11, 12.

The passages 13a, 13b emerge respectively on the first edge 10a and the second edge 10b of the sandwich structure 10.

The core 13 thus globally has a wavy form, in which the top of the waves comes into contact with one of the two plates 11, 12.

In this embodiment, the passages 13a, 13b are each formed by two walls 13' inclined relative to one another and adjacent to one another to form a passage bottom 13c.

Here, the inclined walls 13' of each passage 13a, 13b are adjacent to one of the two plates 11, 12.

Moreover, the passage bottom 13c formed by two inclined walls 13' also comes into contact with one of the two plates 11, 12.

Thus, in this embodiment, the core 13 globally has a wavy form, the waves coming into contact with one or the other of the two plates 11, 12.

The dip of each wave forms a passage 13a, 13b for the cooling fluid, closed by one of the two plates 11, 12 extending between the tops 13c of two neighboring waves.

Thus, the cooling fluid which passes through the passages 13a, 13b is directly in contact with the two plates 11, 12 making it possible to promote a direct cooling of heat-generating components placed in contact with one and/or the other of the two plates 11, 12 as will be described later.

In this embodiment, and in a nonlimiting manner, the core 13 consists more specifically of or comprises a structure having a transverse profile, in zigzag form in the plane at right angles to the longitudinal direction Y of the sandwich structure 10.

Each passage 13a, 13b is thus defined between two inclined walls 13', defining passages of triangular prismatic form.

Each passage 13a, 13b is thus defined between the base of the prismatic form closed by one of the plates 11, 12 and the top of the prismatic form coming into contact with the other of the two plates 11, 12.

A first network of passages 13a is thus defined by inclined walls 13' and a first plate 11 and a second network of channels 13b is defined by inclined walls 13' and a second plate 12.

The core 13 further makes it possible to give the sandwich structure 10 a good rigidity by virtue of its ribbed structure, while forming passages for cooling fluid between the two plates 11, 12 of the sandwich structure 10.

The set of passages 13a, 13b thus comprises passages parallel to one another.

In this embodiment, the passages 13, 13b are identical to one another, notably in terms of width in the plane of the sandwich structure 10.

As clearly illustrated in FIG. 1, the passages 13a, 13b are disposed zigzag fashion from the first edge 10a to the opposite second edge 10b of the sandwich structure 10.

Thus, the passages 13a, 13b are disposed zigzag fashion in a plane parallel to the two plates 11, 12, that is to say in a plane at right angles to the direction of stacking Z of the sandwich structure as illustrated in FIG. 1.

The core 13 is thus made up of a number of successive portions in the longitudinal direction Y of the sandwich structure 10.

The direction of the passages 13a, 13b is modified from one portion to the other in the plane of the sandwich structure 10, according to the zigzag disposition selected.

The zigzag disposition of the passages 13a, 13b from the first edge 10a to the opposite second edge 10b of the sandwich structure 10 makes it possible to increase the length of travel by the cooling fluid through the sandwich structure relative to the longitudinal dimension of the sandwich structure 10. This promotes the cooling of the heat-generating components intended to be placed in contact with one and/or the other of the two plates 11, 12 of the sandwich structure 10.

Moreover, the zigzag disposition of the passages 13a, 13b in the core 13 of the sandwich structure 10 makes it possible to improve the mechanical performance levels of the sandwich structure 10, which can be particularly advantageous when the sandwich structure 10 is used as a structural part of an avionics equipment item as will be described later.

Furthermore, by virtue of the direct contact between the cooling fluid and the plates 11, 12 of the sandwich structure 10, there are no additional thermal interfaces between the heat-generating components 20 to be cooled and the cold plate 30.

Obviously, the exemplary core described previously with reference to FIG. 1 is not limiting, the core 13 being able to have different structures between the two plates 11, 12 provided that it defines a set of passages 13a, 13b.

Figure 6A:
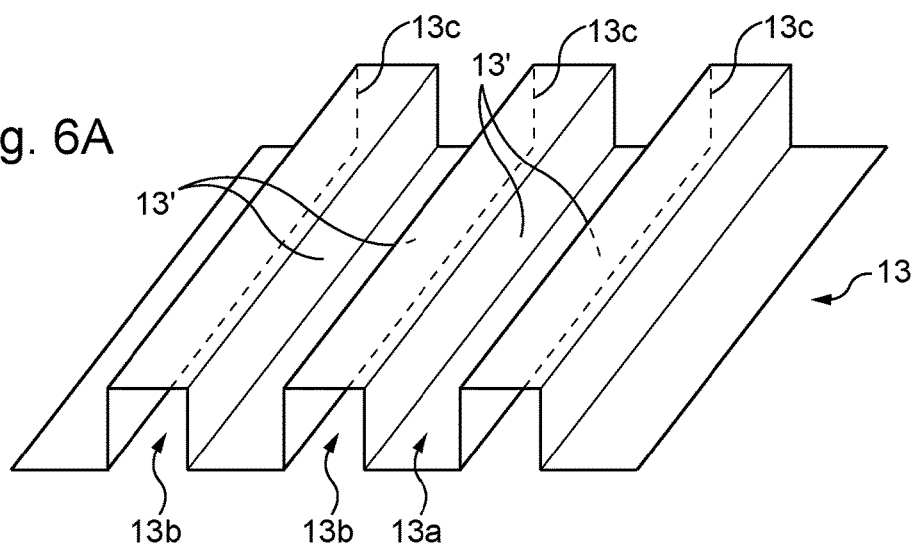
FIGS. 6A and 6B are perspective diagrams illustrating alternative embodiments of a core implemented in a sandwich structure of a cold plate according to different embodiments of the disclosure herein.
Figure 6B:
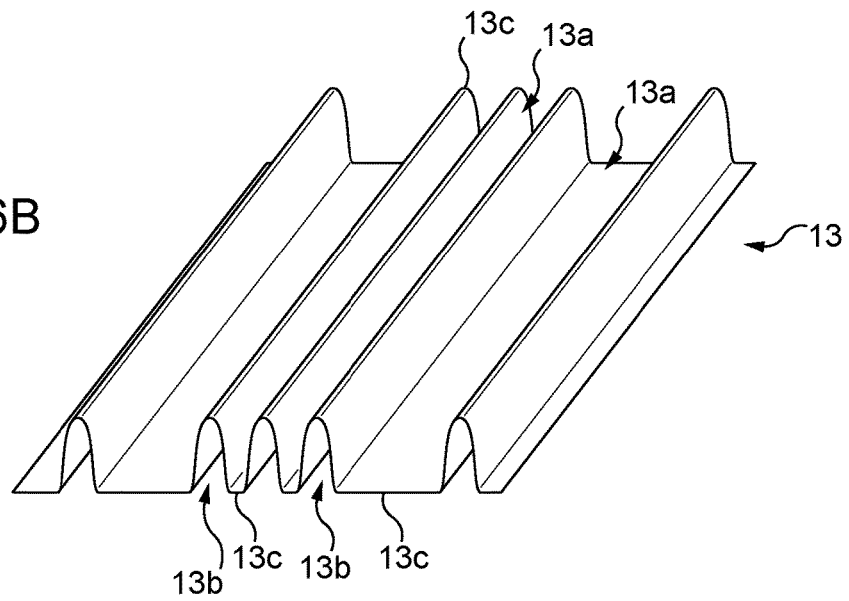

In particular, FIGS. 6A and 6B illustrate two alternative and nonlimiting examples of the structure of a core 13.

In FIG. 6A, the core 13 has a wavy form, the waves having a square or rectangular cross section.

The top 13c of the waves is intended to come into contact with at least one of the two plates 11, 12.

Thus, each passage 13a, 13b comprises two walls 13' which are adjacent to one of the plates 11, 12.

According to the embodiment illustrated in FIG. 6B, the core 13 has a wavy form, the distance between waves being variable such that the width of the passages 13a, 13b can be variable in the transverse direction X of the sandwich structure 10.

These examples of core 13 are purely illustrative and their features can be combined with one another, notably with respect to the width of the passages 13a, 13b and the contact of the core 13 with one and/or the other of the plates 11, 12 of the sandwich structure.

As clearly illustrated in FIGS. 2 and 3, the cold plate 30 incorporating the sandwich structure 10 as described previously with reference to FIG. 1 comprises heat-generating components (schematically represented by the block 20), here placed, in a nonlimiting manner, on one of the two plates 11, 12 of the sandwich structure 10.

Obviously, heat-generating components 20 could be placed on the cold plate in contact with one and/or the other of the two plates 11, 12.

First and second fluid-tight joining members 31, 32 are disposed respectively on the first and second opposite edges 10a, 10b of the sandwich structure 10.

In the example described with reference to FIGS. 2 and 3, the first and second fluid-tight joining members 31, 32 are disposed on the lateral edges of the sandwich structure 10, thus intended to constitute the lateral edges of the cold plate 30.

With all of the passages 13a, 13b formed in the core 13 of the sandwich structure 10 emerging on the first and second edges 10a, 10b of the sandwich structure 10, the first and second fluid-tight joining members 31, 32 are intended to at least partly block the passages 13a, 13b with respect to the passage of a cooling fluid.

The fluid-tight joining members 31, 32 thus generally comprise a wall making it possible to block the set of passages 13a, 13b except in a certain portion of the first and second opposite edges 10a, 10b of the sandwich structure 10 in order to allow for the introduction and the recovery of a cooling fluid.

To that end, in order to allow for the entry and exit of a cooling fluid in the cold plate 30, each fluid-tight joining member 31, 32 comprises at least one fluid connector.

Here, and in a nonlimiting manner, a first fluid-tight joining member 31 comprises an inlet connector 33 intended to introduce a cooling fluid into the cold plate 30 and a second fluid-tight joining member 32 comprises an outlet connector 34 to allow for the discharging of the cooling fluid after passing through the cold plate.

The first and second fluid-tight joining members 31, 32 can be formed by edge fittings, produced in metal or in composite materials.

Generally, the edge fittings 31, 32 are custom-made so as to be adapted to the dimensions of the sandwich structure 10, and notably to its width in the transverse direction X and its thickness in the stacking direction Z.

The edge fittings 31, 32 can also incorporate transfer interfaces with the structure intended to incorporate them, such as, for example, a bearing structure of an aircraft.

In the embodiment illustrated in FIG. 2, the fluid-tight joining members 31, 32 are inserted and fixed between the two plates 11, 12, extending beyond the core 13.

The fluid-tight joining members 31, 32 thus make it possible for a same sandwich structure 10 to define one or more subsets of passages 13a, 13b to form one or more corridors for the passage of a cooling fluid.

By suitably choosing the fluid-tight joining members 31, 32, it is possible to produce cold plates, for one and the same sandwich structure 10, with different corridors for the passage of cooling fluid, suited to the specific use of each cold plate.

The modularity of the cold plates makes it possible to adapt them to the cooling of the heat-generating components disposed on or in the vicinity of one and/or the other of the two plates 11, 12 of the sandwich structure 10.

The fluid-tight joining members 31, 32 can be mounted by bonding between the two plates 11, 12 extending beyond the core 13.

They can also be fixed by removable mounting structure of clip or self-gripping strip type, etc.

In the exemplary embodiment illustrated in FIGS. 3 and 4, each fluid-tight joining member 31, 32 respectively comprises an inlet connector 33 and an outlet connector 34 disposed substantially in the middle, that is to say in a direction corresponding substantially to the central longitudinal direction Y' of the cold plate 30.

Thus, as illustrated in FIG. 4, the inlet connector 33 for a cooling fluid is connected with a subset (the limits of which are shown by emboldened lines in FIG. 4) of the set of passages 13a, 13b.

Here, the subset of the set of passages 13a, 13b corresponds to a portion of the passages 13a, 13b extending in the center of the cold plate 10, in the longitudinal direction Y of the cold plate 30.

The outlet connector 34 for the cooling fluid is then connected with the same subset of the set of passages 13a, 13b in order to allow for the discharging of the cooling fluid.

It will be noted that, depending on the model of the core 13, on the disposition of the passages 13a, 13b and on the type of fluid-tight joining members 31, 32 chosen, the cooling fluid can follow different paths through the cold plate, and more specifically through the core 13 of the sandwich structure 10.

Generally, the cold plate 30 can implement only a single corridor for the passage of a cooling fluid, formed by a subset of the set of passages 13a, 13b, as illustrated for example in FIG. 4.

In this case, a single type of cooling fluid is implemented, and, for example, a liquid such as water or a gas such as air.

As illustrated in FIG. 4, the flow of cooling fluid can be limited in width, and in particular occupy a partial width of the cold plate 30.

However, the cooling fluid circuit could be implemented substantially across the entire width in the transverse direction X of the cold plate 30.

It will be noted that the structure of the core 13 described previously and the production of the passages 13a, 13b between the waves or inclined walls 13' of the core 13 makes it possible to obtain, with no additional element, a fluid-tight closure of the cold plate 30 at the longitudinal edges 30a, 30b.

Thus, the production of the passages 13a, 13b between the waves or inclined walls 13' of the core 13 avoids the use of closing walls along the longitudinal edges 30a, 30b of the cold plate 30.

The production of the cold plate 30 is thus simplified and also allows for a weight saving, particularly advantageous when the cold plate is intended to be used in an aircraft.

Similarly, by virtue of the formation of a set of passages 13a, 13b in the core 13 of the cold plate, the addition of tubings to transport the cooling fluid in the cold plate is avoided.

Such a cold plate consequently has a limited weight, which is perfectly compatible for the targeted uses, and notably in the aeronautical field. Alternatively, and as illustrated in FIG. 5, the cold plate 30 can be designed to implement a number of corridors for the passage of a cooling fluid, and for example two corridors for the passage of cooling fluid (the limits of which are shown by emboldened lines in FIG. 5) each formed by a distinct subset of the set of passages 13a, 13b.

In such a case, the cooling fluid used can be identical in the two subsets of the set of passages 13a, 13b or, on the contrary, the cold plate can implement different cooling fluids, chosen also from liquids, such as water, or gases, such as air.

For the implementation of the embodiment illustrated in FIG. 5, each fluid-tight joining member 31, 32 comprises a number of inlet 35, 36 or outlet 37, 38 connectors.

This disposition thus makes it possible to generate a cooling fluid circuit in two distinct parts of the cold plate 30.

The second embodiment further makes it possible to use different cooling fluids and, for example, associate a liquid cooling fluid such as water with a gaseous cooling fluid such as air.

It will be noted, with reference to FIGS. 4 and 5, that a simple change of the fluid-tight joining members 31, 32 makes it possible, from one and the same sandwich structure 10, to produce a cold plate 30 with different types of corridor for the passage of a cooling fluid through the cold plate 30.

The inlet connectors 33, 35, 36 and the outlet connectors 34, 37, 38 described previously can be of any type, and for example each consist of or comprise quick-release connectors to allow for the easy coupling and simplified mounting/removal of the cold plate 30 within a cooling fluid passage circuit.

These quick-release connectors are conventional components and do not need to be described more specifically here.

In particular, they allow for a quick and fluid-tight connection to pipes 40, as schematically represented in FIGS. 4 and 5.

The system for cooling heat-generating components, obtained by placing heat-generating components 20 in contact with one and/or the other of the two plates 11, 12 of the cold plate 30, allows for an effective cooling of the heat-generating components 20, notably by virtue of the passage of a cooling fluid in the core 13 directly in contact with the plates 11, 12 of the cold plate 30.

Moreover, the sandwich structure 10 makes it possible to give the cold plate 30 a good mechanical rigidity.

The cold plate 30 can thus be used directly as a structural part of an avionics equipment item in an aircraft.

Figure 7:
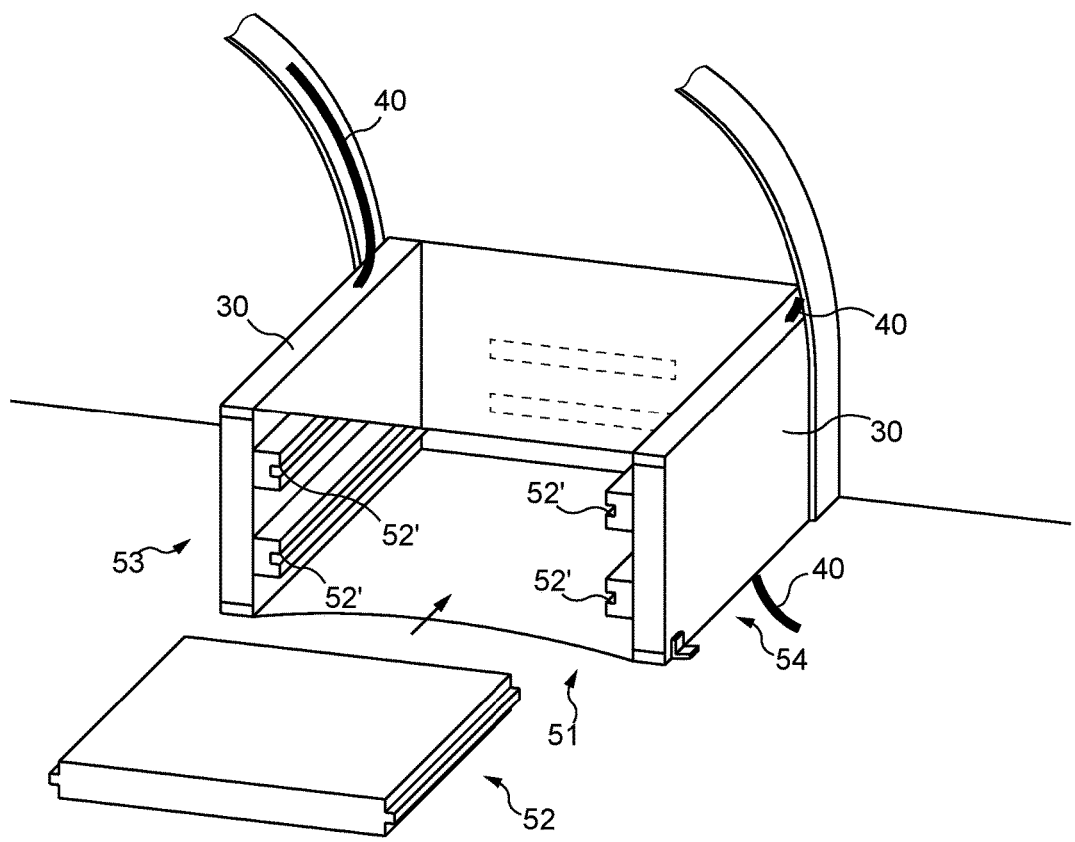
FIG. 7 is a perspective schematic view illustrating an exemplary use of cold plates in an electronic structure of cabinet type.

An example of use of a cold plate 30 has thus been illustrated by way of a non-limiting example in FIG. 7.

More generally, the cold plate 30 can be used as a structural part of an LRU/LRM (acronyms which respectively stand for "Line Replaceable Unit" and "Line Replaceable Module") equipment item, of an electronic structure of cabinet type or of electrical or electronic enclosure type.

Here, as illustrated in FIG. 7, a cabinet 51 intended for the mounting of a (or several) LRU/LRM equipment items 52 comprises two cold plates 30 making it possible to produce a structural part 53, 54 of the cabinet 51, and in the embodiment illustrated in FIG. 7, a left lateral wall 53 and a right lateral wall 54 of the cabinet 51.

The LRU/LRM equipment item 52, intended to be mounted on rails 52' in the cabinet 51, is thus mounted in contact directly with the cold plates 30 forming the lateral walls 53, 54 of the cabinet 51.

It will be noted that the cold plates 30, notably by virtue of their mechanical strength improved by the presence of the core 13 in the sandwich structure 10, are suitable for being equipped with rails 52' for the mounting and the support for the LRU/LRM equipment items 52.

In this type of application, the cold plates 30 are connected to the circuit for the passage of the cooling fluid, and notably connected in a fluid-tight manner to the aircraft pipes (A/C pipes), generically referenced by the tubings 40 in FIG. 7.

Obviously, numerous modifications can be made to the exemplary embodiments described previously.

Thus, the zigzag structure of the core 13 in the plane of the sandwich structure 10 is just one embodiment to form a set of passages in the sandwich structure.

In particular, the passages could extent parallel to the longitudinal direction Y of the sandwich structure 10 and of the cold plate 30.

While at least one exemplary embodiment of the invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A cold plate for cooling heat-generating components, comprising:
   two plates extending parallel to one another and a core disposed between the two plates to form a sandwich structure, the core comprising a set of passages for passing at least one cooling fluid from a first edge to an opposite second edge of the sandwich structure,
   wherein first and second fluid-tight joining members are disposed respectively on the first and second opposite edges of the sandwich structure, the first fluid-tight joining member comprising at least one inlet connector for the at least one cooling fluid and the second fluid-tight joining member comprising at least one outlet connector for the at least one cooling fluid,
   wherein the first and second fluid-tight joining members block all the passages except at least one subset of the set of passages, the at least one inlet connector for at least one cooling fluid being connected with the subset of the set of passages, and the at least one outlet connector for the at least one cooling fluid being connected with the subset of the set of passages.

2. The cold plate according to claim 1, wherein the first fluid-tight joining member, respectively the second fluid-tight joining member, comprises a number of inlet connectors, respectively a number of outlet connectors, for the at least one cooling fluid.

3. The cold plate according to claim 1, wherein the first and second fluid-tight joining members are inserted and fixed between the two plates extending beyond the core.

4. The cold plate according to claim 1, wherein the set of passages comprises passages closed by at least one of the two plates and emerging respectively on the first edge and on the opposite second edge of the sandwich structure.

5. The cold plate according to claim 4, wherein the passages each comprise two walls respectively adjacent to at least one of the two plates.

6. The cold plate according to claim 5, wherein the two walls are inclined relative to one another and adjacent to one another to form a passage bottom.

7. The cold plate according to claim 4, wherein the core has a wavy form, the top of the waves being in contact with at least one of the two plates.

8. The cold plate according to claim 4, wherein the direction of passage of the at least one cooling fluid in the set of passages corresponds to a longitudinal direction of the sandwich structure, the core producing a fluid-tight closure of the cold plate on longitudinal edges of the cold plate.

9. The cold plate according to claim 1, wherein the set of passages comprises passages parallel to one another.

10. The cold plate according to claim 9, wherein the passages are disposed zigzag fashion from the first edge to the opposite second edge of the sandwich structure.

11. A system for cooling heat-generating components, comprising a cold plate according to claim 1, heat-generating components being disposed in contact with at least one of the two plates.

12. A method of using a cold plate, the method comprising:
   providing a cold plate for cooling heat-generating components, the cold plate comprising:
      two plates extending parallel to one another and a core disposed between the two plates to form a sandwich structure, the core comprising a set of passages for passing at least one cooling fluid from a first edge to an opposite second edge of the sandwich structure,
      wherein first and second fluid-tight joining members are disposed respectively on the first and second opposite edges of the sandwich structure, the first fluid-tight joining member comprising at least one inlet connector for the at least one cooling fluid and the second fluid-tight joining member comprising at least one outlet connector for the at least one cooling fluid,
      wherein the first and second fluid-tight joining members block all the passages except at least one subset of the set of passages, the at least one inlet connector for at least one cooling fluid being connected with the subset of the set of passages, and the at least one outlet connector for the at least one cooling fluid being connected with the subset of the set of passages; and
   using the cold plate as a structural part of an avionics equipment item in an aircraft.

* * * * *